United States Patent
Shinkai et al.

(10) Patent No.: US 8,859,883 B2
(45) Date of Patent: Oct. 14, 2014

(54) ELECTRIC POWER GENERATION METHOD USING SOLAR CELLS AND PHOTOVOLTAIC POWER GENERATION SYSTEM

(75) Inventors: Yasuhiro Shinkai, Tokyo (JP); Makio Uchida, Kawagoe (JP); Ayako Kumasaka, Tokyo (JP); Jun'ichi Hirota, Hirosaki (JP)

(73) Assignee: Hitachi, Ltd., Tokyo (JP)

( * ) Notice: Subject to any disclaimer, the term of this patent is extended or adjusted under 35 U.S.C. 154(b) by 93 days.

(21) Appl. No.: 13/034,181

(22) Filed: Feb. 24, 2011

(65) Prior Publication Data

US 2011/0259399 A1 Oct. 27, 2011

(30) Foreign Application Priority Data

Apr. 27, 2010 (JP) ................................ 2010-101749

(51) Int. Cl.
| | | |
|---|---|---|
| H02N 6/00 | (2006.01) | |
| H01L 31/00 | (2006.01) | |
| H01L 31/042 | (2014.01) | |
| H01L 31/055 | (2014.01) | |

(52) U.S. Cl.
CPC ............... H01L 31/055 (2013.01); *Y02E 10/52* (2013.01)
USPC .......................................... 136/247; 136/253

(58) Field of Classification Search
CPC .................................................... H01L 31/055
USPC ........ 136/247, 253, 257; 310/303, 305; 429/5
See application file for complete search history.

(56) References Cited

U.S. PATENT DOCUMENTS

| | | | | | |
|---|---|---|---|---|---|
| 3,031,519 | A | * | 4/1962 | Silverman | ...................... 136/253 |
| 3,932,756 | A | * | 1/1976 | Cowell et al. | ............. 250/361 R |
| 4,242,147 | A | * | 12/1980 | DeToia | .......................... 136/253 |
| 5,607,519 | A | * | 3/1997 | Krepak | .......................... 136/253 |
| 2003/0051750 | A1 | * | 3/2003 | Lawheed | ...................... 136/246 |
| 2006/0289832 | A1 | | 12/2006 | Watchi et al. | |
| 2008/0318357 | A1 | * | 12/2008 | Raffaelle et al. | ................. 438/56 |
| 2009/0101196 | A1 | | 4/2009 | Bergmann et al. | |

FOREIGN PATENT DOCUMENTS

| | | |
|---|---|---|
| JP | 7-274416 A | 10/1995 |
| JP | 7-274417 A | 10/1995 |
| JP | 2002-239397 A | 8/2002 |

(Continued)

OTHER PUBLICATIONS

Unknown, "Public Health Statement for Americium," Apr. 2004.*
Intensifying Screen and Fluorescent Plate, Kasei Optionix, Ltd., Sep. 2001, with partial translation of pp. 17 and 18.

(Continued)

*Primary Examiner* — Eli Mekhlin
(74) *Attorney, Agent, or Firm* — Crowell & Moring LLP (57) ABSTRACT

A photovoltaic power generation system includes a plurality of power generation panels and a power conditioner. The power generation panels and a radiation source are placed in a solar cell storage room buried typically in the ground. The radiation source includes radioactive waste generated in reprocessing of spent nuclear fuel. Each power generation panel has a phosphor member and a moderator member, which are disposed in that order on solar cells placed on a board. Radiation (for example, a gamma ray) emitted from the radiation source is injected on the power generation panel and is moderated by the moderator member. When the gamma ray with the reduced energy (below 100 keV) is injected on the phosphor member, it emits visible light. When the visible light is injected on the solar cells, electric power is generated.

12 Claims, 7 Drawing Sheets

(56) References Cited

FOREIGN PATENT DOCUMENTS

| | | |
|---|---|---|
| JP | 2002-341094 A | 11/2002 |
| JP | 2003-218367 A | 7/2003 |
| JP | 2004-297025 A | 10/2004 |
| JP | 2007-527440 A | 9/2007 |
| JP | 2007-313823 A | 12/2007 |
| JP | 2009-76898 A | 4/2009 |

OTHER PUBLICATIONS

Masataka Ito, et al., "Power Generation Principle, Type and Characteristics of Solar Cell", Chion No. 31, Principle of Electric Power Generation by Solar Cell and its Types and Characteristics, University of Tsukuba, 2009, No. 45 and partial translation.
Japanese Office Action dated Jun. 24, 2014, including partial English translation (eight (8) pages).

* cited by examiner

ELECTRIC POWER GENERATION METHOD USING SOLAR CELLS AND PHOTOVOLTAIC POWER GENERATION SYSTEM

CLAIM OF PRIORITY

The present application claims priority from Japanese Patent application serial no. 2010-101749, filed on Apr. 27, 2010, the content of which is hereby incorporated by reference into this application.

BACKGROUND OF THE INVENTION

1. Technical Field

The present invention relates to an electric power generation method using solar cells and a photovoltaic power generation system, and more particularly to an electric power generation method using solar cells and a photovoltaic power generation system suitable to use radiation emitted from radioactive waste that is generated by reprocessing spent nuclear fuel, for power generation.

2. Background Art

The photoelectric power generation systems are known as the solar electric power generation systems. These solar electric power generation systems are provided with solar cells that convert energy in the visible light region (400 to 800 nm), which is part of optical energy released from the sun, into electric power.

An alpha-ray irradiation solar cell that uses radiation emitted from a radiation source (Co-60) is known as one kind of solar power generation system (see Japanese Patent Laid-open No. 2002-341094). In alpha-ray irradiation solar cell, a phosphor film is formed on a top surface of a solar cell, a plutonium 238 layer is formed on the phosphor film, and then a transparent conductive film and glass substrate are formed in that order on the plutonium 238 layer. When X-rays are injected through the glass substrate, the solar cell generates electric power. The use of the fluorescent material increases electromotive force.

It is also described that radiation (beta-rays and gamma-rays) emitted from Co-60 is applied to the alpha-ray irradiation solar cell. When these radiation are injected on the plutonium 238 layer, more alpha rays are generated in the plutonium 238 layer and thereby fluorescence emission by the fluorescent material is increased. As a consequence, the electric power generated in the solar cells increases.

Japanese Patent Laid-open No. 7(1995)-274417 discloses an electric power supply system in a micro machine that internally inspects heat exchanger tubes in a condenser. A phosphor layer is formed on an inner surface of the heat exchanger tube. A surface of a main body of the micro machine is covered with a photovoltaic device. Radiation is injected from an outside of the heat exchange tube to the phosphor layer, and fluorescence is emitted from the phosphor layer. The emitted fluorescence is injected into the photovoltaic device, causing the photovoltaic device to generate electric power. The generated electric power is supplied to internal circuits of the micro machine.

Characteristics of calcium tungsten oxide ($CaWO_4$) and gadolinium oxysulfide activated by terbium ($Gd_2O_2S:Tb$), which are fluorescent materials, are described in Intensifying Screen and Fluorescent Screen, Kasei Optonix, Ltd. Sep. 2001, pages 17 and 18.

The energy spectrum of visible light from the sun and the sensitive wavelength region in an amorphous silicon solar cell and single crystalline silicon solar cell are described respectively in Chion No. 31, Principle of Electric Power Generation by Solar Cell and its Types and Characteristics, University of Tsukuba, Masataka Ito, No. 45, 2009.

CITATION LIST

Patent Literature

Patent literature 1: Japanese Patent Laid-open No. 2002-341094

Patent literature 2: Japanese Patent Laid-open No. 7(1995)-274417

[Non-Patent Literature]

Non-patent literature 1: Intensifying Screen and Fluorescent Screen, Kasei Optonix, Ltd. Sep. 2001, pages 17 and 18

Non-patent literature 2: Chion No. 31, Principle of Electric Power Generation by Solar Cell and its Types and Characteristics, University of Tsukuba, Masataka Ito, No. 45, 2009

SUMMARY OF THE INVENTION

Technical Problem

In the alpha-ray irradiation solar cell described in Japanese Patent Laid-open No. 2002-341094, when X-rays are injected, for example, a current of 83.0 µA and a voltage of 3.3 V are obtained (see Table 2), and when radiation emitted from Co-60 is injected, for example, a current of 0.115 µA and a voltage of 1.1 V are obtained (see Table 8). The electric power supply system described in Japanese Patent Laid-open No. 7(1995)-274417 produces an electric power of 0.304 mW.

The inventors considered the use of radiation emitted from a residue, which remains after nuclear fuel materials (uranium, plutonium, etc.) have been recovered from spent nuclear fuel by the reprocessing of the spent nuclear fuel, to generate electric power. The residues generated in the reprocessing of the spent nuclear fuel include Cs-137, Sr-90, and other radioisotopes with a very long half-life time. These residues are vitrified as high-level radioactive wastes and buried in the ground. This method of treating residues is a promising method.

The energy of ionizing radiation (X-rays, beta rays, gamma rays, and neutrons, etc.) emitted from Cs-137 and Sr-90, etc. is as high as 10 keV or more. For example, a gamma ray emitted from Cs-137 has an energy of 660 keV. A beta ray emitted from Sr-90 or Y-90 has an energy of 2.28 MeV. An ionizing radiation emitted from Co-60 has an energy of 1.1 MeV. Even when an ionizing radiation having high energy as described above is injected to a phosphor and this phosphor emits fluorescence (visible light) and the emitted fluorescence (visible light) is injected on a solar cell, the solar cell generates only a small amount of electric power as in the electric power supply system described in Japanese Patent Laid-open No. 7(1995)-274417.

An object of the present invention is to provide an electric power generation method using solar cells and a photovoltaic power generation system that can further increase the amount of electric power generated.

Solution to Problem

The present invention for attaining the above object is characterized in that radiation emitted from a radiation source is moderated by a moderator, the radiation with energy reduced by the moderator is injected to a phosphor member, visible light is generated in the phosphor member by injecting the moderated radiation to the fluorescent substance, and electric power is generated in a solar cell by injecting the visible light to the solar cell.

Since the radiation from the radiation source is moderated to reduce the energy of the radiation and the radiation with the reduced energy is injected to the phosphor member, the amount of electrons staying at a second stable level of a crystal included in the phosphor member is increased. This increases the amount of electrons that emit their energy and return from the second stable level to the first stable level of the crystal. Since the energy emitted when each electron returns from the second stable level to the first stable level contributes to the generation of visible light, the increase in the amount of electrons staying at the second stable level leads to an increase in the amount of visible light. As a result, the amount of electric power generated by the solar cell to which the visible light is injected is increased.

A radiation source including radioactive waste generated in reprocessing of spent nuclear fuel is preferably used as the radiation source. When the radiation source including the radioactive waste is used, radiation emitted from radioisotopes with a long half-life time, which is included in the radioactive waste, can be used for power generation. That is, although radioactive wastes have been handled as cumbersome high-level radioactive wastes, they can be used as effective resources in electric power generation using solar cells. The amount of radioactive wastes that are vitrified is also reduced.

Advantageous Effect of the Invention

According to the present invention, the amount of electric power generated by solar cells can further be increased.

DETAILED DESCRIPTION OF THE PREFERRED EMBODIMENTS

The inventors studied an electric power generation method in which ionizing radiation is used. This ionizing radiation is emitted from radioactive waste that was generated in reprocessing of spent nuclear fuel. The results in this study will be described below in detail.

It is known that when energy is given to a substance, such as zinc sulfide (ZnS), present in the nature by illumination with light (including X-rays, gamma rays, electron rays, and other radiations), the substance emits light with a wavelength specific to the substance (in this case, light near visible light). The emitted light is called fluorescence, and a member made of a substance that emits fluorescence is called a phosphor member. A band model that makes a light emitting mechanism of the phosphor member, easiest to understand will be used in explanation.

Figure 2:
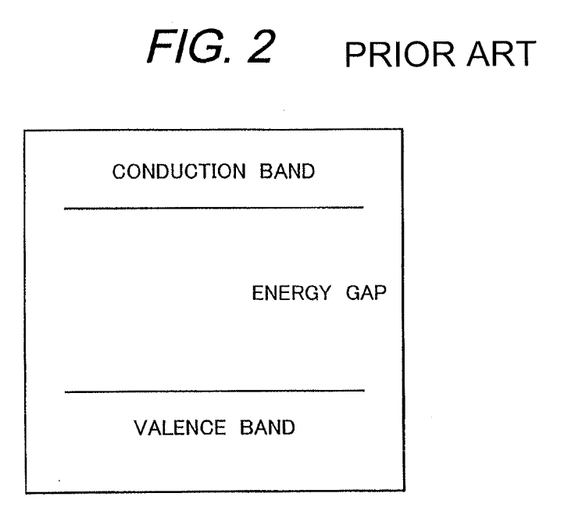
FIG. 2 is an explanatory drawing showing a band model for fluorescent substance that emits fluorescence.

A solid crystal forms an energy band according to its crystal structure (See FIG. 2). The conduction band indicates a state in which electrons in a substance can freely move. The energy gap indicates a state in which the presence of electrons is not allowed. The valence band indicates a state in which electrons are strongly bound to the atom of the substance and thereby cannot freely move.

In general, a substance with a pure crystal structure has a band structure as shown in FIG. 2. All electrons in the substance are present in the valence band. When energy is given to the substance, electrons in the valence band are excited to the conduction band and flow out of the valence band as a current. Therefore, the substance never emits fluorescence.

Figure 3:
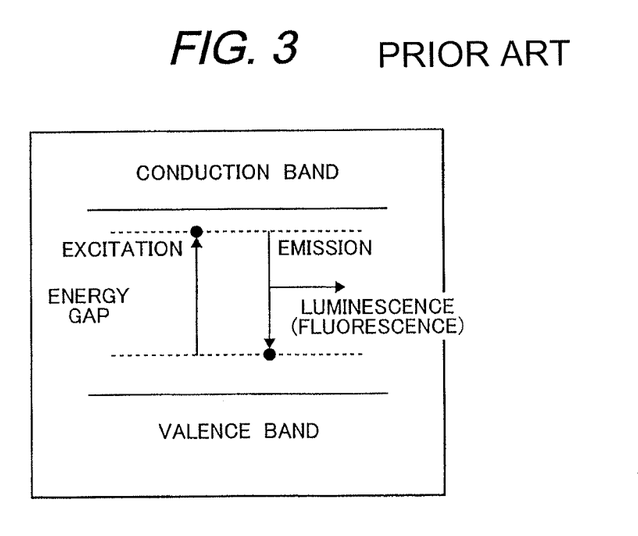
FIG. 3 is an explanatory drawing showing a mechanism by which fluorescent substance emits fluorescence.

If a small amount of impurity is added to some pure crystals, however, stable levels are generated in the energy gap shown in FIG. 2. FIG. 3 schematically shows a state in which these stable levels are generated. As the result of adding a small amount of impurity to the crystal, the stable levels (fluorescence levels) indicated by the dotted lines are generated in the energy gap. At the stable level generated near the valence band, electrons that have seeped out of the valence band are present. If, in this state, light (or a radiation) with energy larger than a difference in energy between the two stable levels indicated by the dotted lines, that is, a difference between the energy at the upper stable level (referred to below as the second stable level) formed in the proximity of the conduction band and the energy at the lower stable level (referred to below as the first stable level) formed in the proximity of the valence band, enters the substance, electrons present at the first stable level are excited to the second stable level. Since the second stable level is lower than the level of the conduction band, the electrons excited from the first stable level do not flow out of the second stable level as a current but stay at the second stable level for a predetermined time, called the level life time, which is usually 1 ps or less. The electrons staying at the second stable level then emit energy equivalent to a difference in energy between the first stable level and second stable level, and the electrons are returned from the second stable level to the original first stable level. The energy emitted at that time is called "fluorescence in the broad sense". When the emitted energy is denoted hv, the wavelength $\lambda$ of the emitted light can be obtained from the following equation: $hv=1240/\lambda$.

If the wavelength λ of the emitted light is 400 nm≤λ≤800 nm, the light can be observed as visible light. Light with a wavelength in this range is called "fluorescence in the narrow sense".

Figure 7:
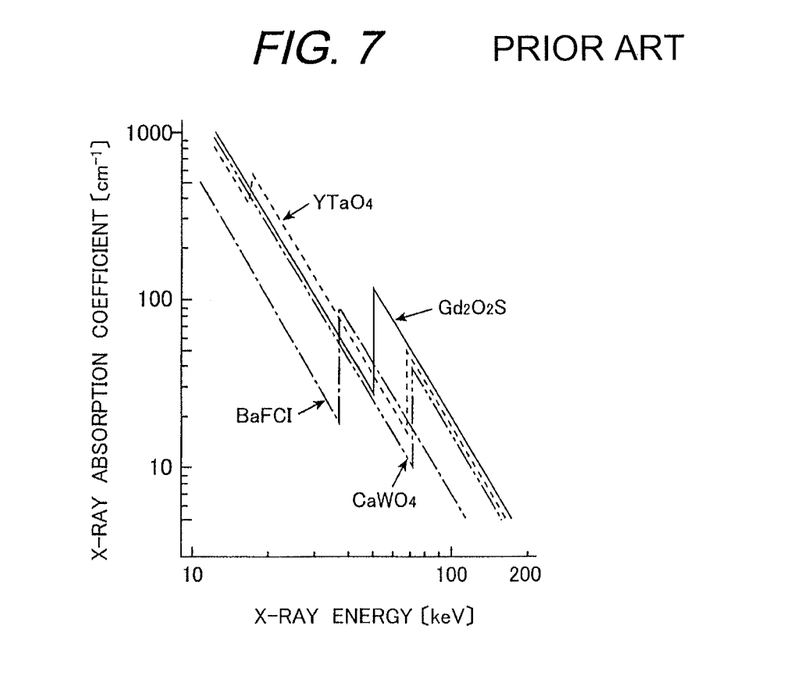
FIG. 7 is a characteristic drawing showing X-ray absorption coefficients of phosphor materials.
Figure 8:
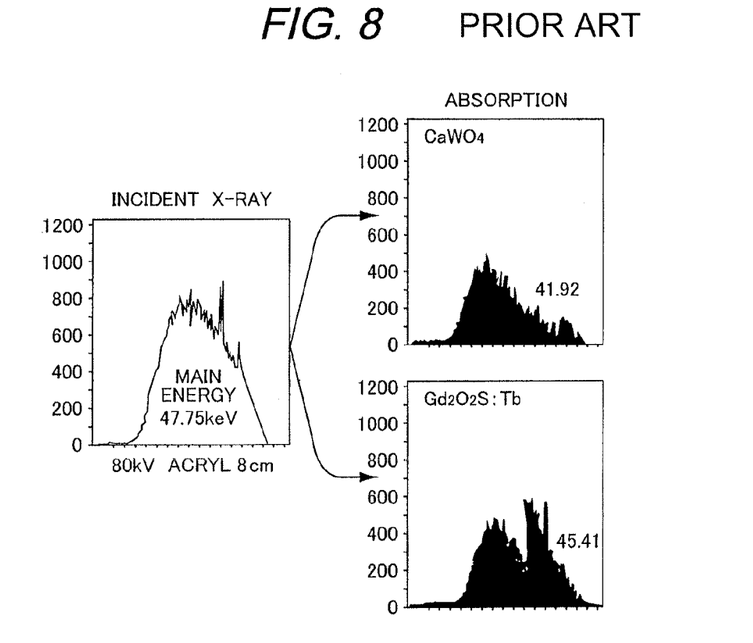
FIG. 8 is an explanatory drawing showing states of X-ray absorption by phosphor materials.

When large energy is given to a substance, even if the substance has crystals to which an impurity is added, incident photons inherently do not cause interaction with the substance, as illustrated in FIGS. 7 and 8. If a substance does not cause interaction with incident photons with large energy, the substance is regarded by the incident photons as if its thickness were reduced. Accordingly, energy is no longer given from the photons to the substance, reducing fluorescence emitted by the substance. Specifically, the amount of fluorescence emitted by the phosphor member is lessened. When the energy of the photons is almost equal to the energy in the energy gap, the possibility that the substance may obtain energy from the photons is maximized. At that time, the amount of fluorescence emitted by the substance is maximized.

The reason why the amount of electric power generated by the solar cells in Japanese Patent Laid-open No. 2002-341094 and Japanese Patent Laid-open No. 7(1995)-274417 is small is that the gamma rays emitted from Co-60 and injected on the phosphor member have very high energy. When the gamma rays with very high energy emitted from the Co-60 are injected on the phosphor member, the amount of electrons staying at the second stable level is reduced due to the reason described above. This reduces the amount of fluorescence emitted by the phosphor member, and thereby the solar cells in Japanese Patent Laid-open No. 2002-341094 and Japanese Patent Laid-open No. 7(1995)-274417 generate less electric power.

To address the above problem, the inventors found that to increase the amount of electric power generated by a solar cell, the energy of radiation injected on a phosphor member from which to emit visible light must fall within an appropriate range.

A phosphor member is made of a substance having solid crystals that include an impurity and generate the first and second stable levels. When light in the visible light region (400 nm≤λ≤800 nm) is generated, emitted energy hV is within a range of 1.5 eV≤hV≤3 eV. The difference in energy between the first stable level and second stable level of the phosphor member is 1.5 eV to 3 eV. Accordingly, if light with an energy of at least 3 eV and at most 100 keV is injected on a phosphor member, the phosphor member can efficiently emit fluorescence.

Since ionizing radiation is used, which is emitted from radioactive waste that was generated in the reprocessing of the spent nuclear fuel, the inventors considered the use of a fluorescent material in medical applications (X-ray shocks), which is field-proven, or of a fluorescent material intended for cathode-ray tubes (electron impacts) as the fluorescent material for the phosphor member. Two fluorescent materials described below are mainly used in the medical field. These fluorescent materials are used on different intensifying screens.

Figure 4:
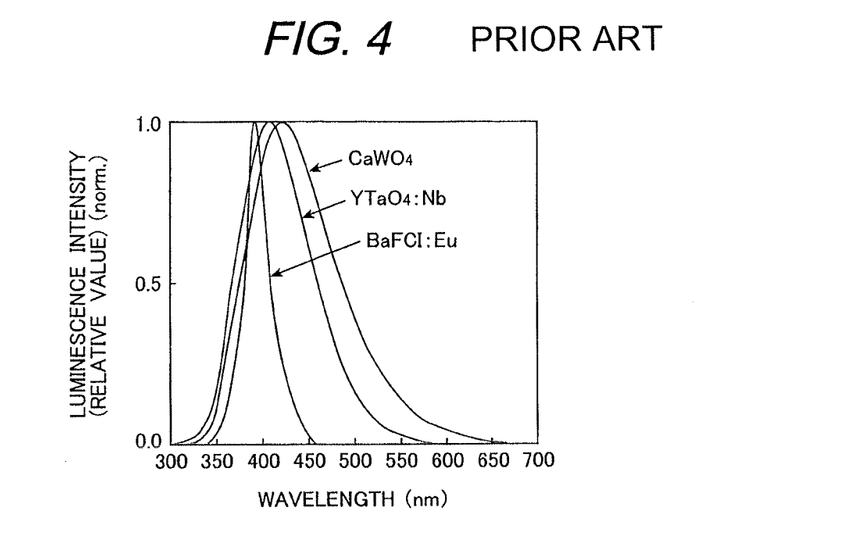
FIG. 4 is an explanatory drawing showing a continuous energy spectrum of fluorescence emitted from phosphor from an intensifying screen including $CaWO_4$.
Figure 5:
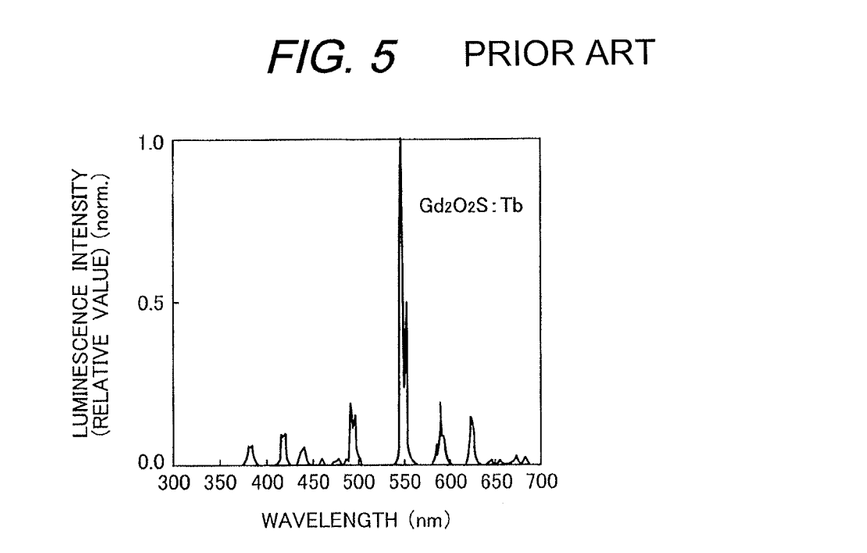
FIG. 5 is an explanatory drawing showing a narrow line energy spectrum of fluorescence emitted from phosphor from an intensifying screen including $Gd_2O_2S:Tb$.

A first fluorescent material is of a standard type, which is made of calcium tungsten oxide ($CaWO_4$). It forms a first intensifying screen. When radiation is injected on $CaWO_4$, it emits blue fluorescence, which is a continuous spectrum. The luminescence intensity of the fluorescence is maximized when its wavelength λ is 425 nm (see FIG. 4). A second fluorescent material is an improved type, which is made of gadolinium oxysulfide activated by terbium ($Gd_2O_2S$:Tb). It forms a second intensifying screen, which is different from the first intensifying screen described above. When radiation is injected on $Gd_2O_2S$:Tb, it emits green fluorescence, which is a narrow linear spectrum. The luminescence intensity of the fluorescence is maximized when its wavelength λ is 545 nm, which is close to the central wavelength, 550 nm, in the visible light region (see FIG. 5). FIGS. 4 and 5 show the emission spectra of various types of fluorescent materials, with the wavelength of emitted fluorescence on the horizontal axis and the relative luminescence intensity of the emitted fluorescence on the vertical axis. The emission spectra in FIGS. 4 and 5 are shown as FIG. 1-17 in Intensifying Screens and Fluorescent Screens, Kasei Optonix, Ltd. Sep. 2001, page 17.

It can be understood that when the first and second intensifying screens used as the fluorescent materials are irradiated with the radiation, if adequately strong visible light is obtained by the fluorescent materials of these intensifying screens, the solar cell can convert the light into electric power. Which intensifying screen, the first or second intensifying screen, well matches the solar cell depends on the operation wavelength of the solar cell.

Figure 6:
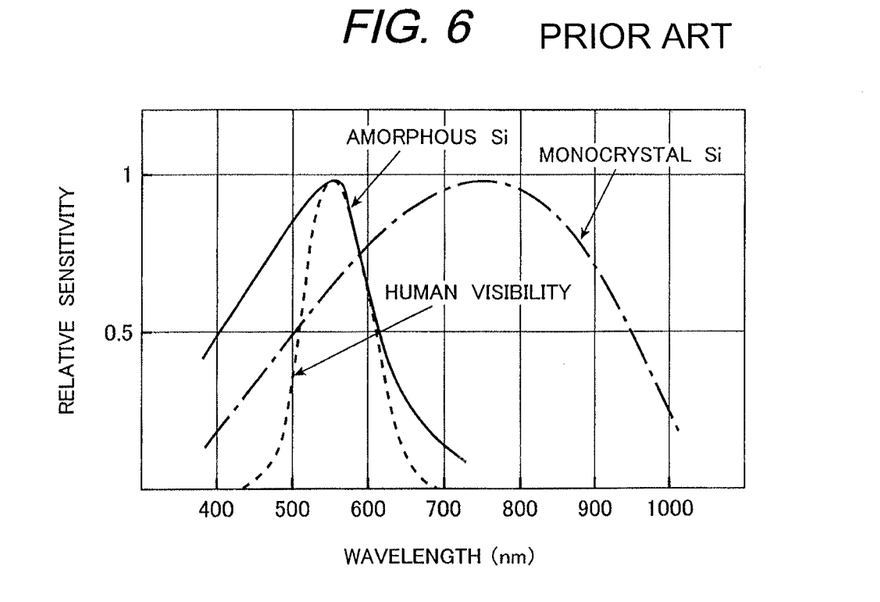
FIG. 6 is an explanatory drawing showing spectra of sensitive visible light region in various types of solar cells.

FIG. 6 illustrates spectra which sensitive in various types of solar cells. The characteristics in FIG. 6 are shown in Chion No. 31, Principle of Electric Power Generation by Solar Cell and its Types and Characteristics, University of Tsukuba, Masataka Ito, No. 45, 2009. With silicon solar cells, which are currently dominant, as shown in FIG. 6, single crystalline silicon solar cells (including polycrystalline silicon solar cells) tend to have a peak when their wavelength is from 700 to 800 nm, and amorphous silicon solar cells tend to have a peak when their wavelength is from 500 to 600 nm. When the wavelengths of these types of silicon solar cells are short, efficiency tends to be abruptly lower. As a result, the most efficient fluorescent material is $Gd_2O_2S$:Tb, and the second most efficient fluorescent material is $CaWO_4$. An amorphous silicon solar cell rather than a single crystalline silicon solar cell is preferably used.

The inventors studied about the energy of radiation irradiated to a phosphor member such as an intensifying screen used in the medical field. As a result, the inventors confirmed that if the energy of radiation irradiated to the phosphor member is much larger than a difference between energy corresponding to the first stable level and energy corresponding to the second stable level, fluorescence (visible light) emitted by the phosphor member is also significantly lessened and thereby only a very small amount of electric power is generated by the solar cell. The process and result of this confirmation will be described below.

Photons such as X-rays and gamma rays will be considered as radiation. There are three interactions between photons and a fluorescent substance of the phosphor member, that is, photoelectric effect, Compton scattering, and electron-positron pair creation. The phosphor member absorbs the energy of the incident radiation by these three interactions. However, the electron-positron pair creation is not caused unless radiation with an energy of 1 MeV or more is irradiated to the phosphor member. Since ionizing radiation (such as, for example, a gamma ray) emitted from a radioactive waste that was generated in the reprocessing of the spent nuclear fuel and only has an energy of less than 1 MeV, the electron-positron pair creation is not caused in the phosphor member. Accordingly, the photoelectric effect and Compton scattering will be studied. The interaction when the phosphor member emits fluorescence is the photoelectric effect.

The photoelectric effect is a phenomenon in which photons interact with an atom of the substance to which the photons are irradiated and all energy of the photons is given to electrons bound to the atom. An electron bound to the atom of the substance constituting the phosphor receives energy proportional to the fourth power of the atomic number of the substance to which photons are irradiated, from the illuminating photon. When the energy of the photon is large, however, the energy is abruptly lessened (see FIG. 7). The characteristics in FIG. 7 are shown as FIG. 1-18 in Intensifying Screens and Fluorescent Screens, Kasei Optonix, Ltd. Sep. 2001, page 18.

FIG. 7 indicates that when the energy of radiation increases, its absorption coefficient exponentially decreases. This is because when the energy of an X-ray or gamma ray becomes large, the thickness of the fluorescent material is equivalently reduced and the fluorescent material no longer interacts with photons. Therefore, even if photons with an energy of 200 to 300 keV or more are injected to the phosphor member, the phosphor member does not emit fluorescence. In FIG. 7, the radiation absorption coefficient of $Gd_2O_2S$:Tb is temporarily increased at 50 keV and that of $CaWO_4$ is temporarily increased at 70 keV. These energy values are exactly equal to the ionization energy of the electrons on the innermost electron shell at a position called the K absorption end of the pertinent substance. At this energy level, the radiation absorption coefficient of the pertinent phosphor member becomes large. As a result, to most efficiently emit fluorescence from a phosphor member, the energy of photons must be 100 to 120 keV or less.

FIG. 8 shows a state of radiation absorption by phosphor members when X-rays generated by using an 80-keV X-ray tube are injected on the phosphor members. Each fluorescent material of $Gd_2O_2S$:Tb and $CaWO_4$ described above generates the largest amount of light with an energy of 80 keV. FIG. 8 indicates that the $Gd_2O_2S$:Tb absorbs almost all incident X-rays. Although the $CaWO_4$ has a lower absorption coefficient than the $Gd_2O_2S$:Tb, the $CaWO_4$ adequately absorbs incident radiation. The characteristics in FIG. 8 are shown as FIG. 1-19 in Intensifying Screens and Fluorescent Screens, Kasei Optonix, Ltd. Sep. 2001, page 18.

A radioactive waste that was generated in the reprocessing of the spent nuclear fuel is used as a radioactive source of radiation injected to the phosphor member. The main component of the radioactive waste is Cs-137 (the energy of the emitted gamma-ray is 660 keV). In addition to CS-137, the radioactive waste includes Sr-90. Sr-90 becomes Y-90 due to beta decay. Y-90 further causes beta decay and becomes stable Zr-90. Since the energy of the gamma ray, which is radiation emitted from Cs-137, is as high as 660 keV, interaction of that gamma ray with the phosphor members, which use $Gd_2O_2S$:Tb and $CaWO_4$ separately, cannot be expected. Accordingly, this high energy of the gamma ray must be reduced to an energy region needed by the phosphor member to emit light. This reduction of the gamma ray energy is carried out by using the Compton scattering.

The Compton scattering is a interaction in which photons and the atomic nuclei of a substance scatter, the kinetic energy of the photons is converted into the kinetic energy of the atomic nucleus by the scattering, and thereby the energy of the photons is reduced. Since the energy of radiation is reduced, this phenomenon is called photon moderation. In The Compton scattering, a photon transfers part of its energy to the atomic nucleus. Since the photon still has energy, however, the photon travels in a different direction after the scattering by the atomic nucleus. Then, the photon hits some atomic nuclei and scatters several times. When the energy possessed by the photon is reduced to the photoelectric effect region after the several scatterings, the photon is absorbed by the fluorescent substance of the phosphor member due to the photoelectric effect, and the fluorescence can be emitted from the phosphor member. To reduce the high energy of the photon (radiation) to low energy in the photoelectric effect region, a moderator may be used. The use of a moderator enables the energy of a gamma ray emitted from, for example, Cs-137 to be reduced from 660 keV to 120 keV. Therefore, the energy can be efficiently retrieved from the phosphor member as fluorescence.

As a result of the above studying, the inventors has found a new knowledge that to efficiently generate electric power by making incidence radiation emitted from radioactive waste generated in the reprocessing of the spent nuclear fuel to the phosphor member and making incidence visible light generated by the phosphor member to a solar cell, the use of a moderator is indispensable to moderate the radiation emitted from the radioactive waste. Thus, the inventors studied moderators that moderate the radiation emitted from the radioactive waste.

The degree of the Compton scattering is proportional to the first power of the atomic number of the atom included in the moderator. The larger the atomic number of the atom included in the moderator is, the larger the moderation effect on the radiation by the moderator is. Lead and tungsten that are heavy metal are effective, as the moderator. Gamma rays with high energy can be moderated by using a moderator member made of lead (or tungsten). However, lead and tungsten also function as a radiation shielding material. If the moderator member made of the lead or tungsten moderator is thickened, it is more effective in radiation shielding than in moderation. The gamma rays with low energy generated by the moderation effect are thereby absorbed.

After various studies, the inventors found that thickness of the moderator member made of lead, tungsten, and the like should be 1 μm to 1 mm so that the moderation effect is larger than the radiation shielding effect. When the thickness of the moderator is 1 μm to 1 mm, low-energy radiation in the photoelectric effect region can be obtained by moderating high-energy radiation emitted from the above radioactive waste (660-keV gamma rays emitted from Cs-137, for example). Then, it is possible to obtain visible light, which enables a solar cell to efficiently generate electric power, from the phosphor member.

The inventors studied moderation possible with the moderator member with a thickness of 1 μm to 1 mm. Compton scattering can be accurately resolved kinetically by the Kline-Nishina formula. However, the energy of radiation (gamma ray, for example) emitted from a radioactive waste is substantially halved by one scattering. Accordingly, to reduce the energy of a gamma ray emitted from Cs-137 from 660 keV to 100 keV, it suffices to scatter the gamma ray two or three times by using the moderator member. Specifically, when the gamma ray is scattered twice, its energy is reduced by a factor of four; when the gamma ray is scattered three times, its energy is reduced by a factor of eight.

The radioactive wastes, which emit the radiation contributing to electric power generation in solar cells, must be stored in a room surrounded by concrete sidewalls, a floor, and a ceiling to shield the radiation. The radiation emitted from the residues is moderated not only by the moderator member but also through reflection on the sidewalls of the above room. In view of the moderation through reflection on the sidewalls as well, when high-energy radiation is scattered twice or so, the energy can be reduced to energy in the photoelectric field region.

A fluorescent material used in phosphor members, intended for a cathode-ray tube, that emits fluorescence by electron impacts may be used instead of a fluorescent material ($Gd_2O_2S$:Tb or $CaWO_4$) applied to an intensifying screen used in the medical field. Examples of these types of fluorescent materials for cathode-ray tubes include copper and aluminum doped zinc sulfide (ZnS:Cu,Al), copper, gold, and aluminum doped zinc sulfide (ZnS:Cu, Au, Al), and europium doped yttrium oxysulfide ($Y_2O_2S$:Eu). ZnS:Cu,Al emits yellowish green fluorescence with a wavelength ($\lambda$) of 530 nm when radiation is injected on it. Similarly, ZnS:Cu,Au,Al emits yellowish green fluorescence with a wavelength ($\lambda$) of 535 nm, and $Y_2O_2S$:Eu emits red fluorescence with a wavelength ($\lambda$) of 620 nm. ZnS:Cu,Al also reacts well with X-rays and gamma rays. Fluorescent materials for cathode-ray tubes undergo impacts by a very large number of electrons in cathode-ray tubes, so these fluorescent materials have strong resistance to deterioration due to lattice defects and the like. A phosphor member made of any one of ZnS:Cu,Al, ZnS:Cu, Au,Al, and $Y_2O_2S$:Eu may be used.

From the result of the above study, the inventors newly found that ionizing radiation emitted from radioactive waste generated in the reprocessing of the spent nuclear fuel can be used for electric power generation by use of solar cells. Specifically, the inventors have created a new electric power generation system in which ionizing radiation emitted from radioactive waste generated in the reprocessing of the spent nuclear fuel is moderated by a moderator member, after which the moderated radiation is injected on a phosphor member, visible light generated by the incident ionizing radiation in the phosphor member is injected, and electric power generate in the solar cells.

Embodiments of the present invention will be described below.

[Embodiment 1]

An electric power generation method using solar cells according to embodiment 1 which is a preferred one embodiment of the present invention will be described below. First, a photovoltaic power generation system used in this electric power generation method will be described with reference to FIG. 1. The photovoltaic power generation system 1 in the present embodiment is provided with a plurality of power generation panels 2, a power conditioner (DC-AC conversion apparatus) 9, and a radiation source 11.

Figure 1:
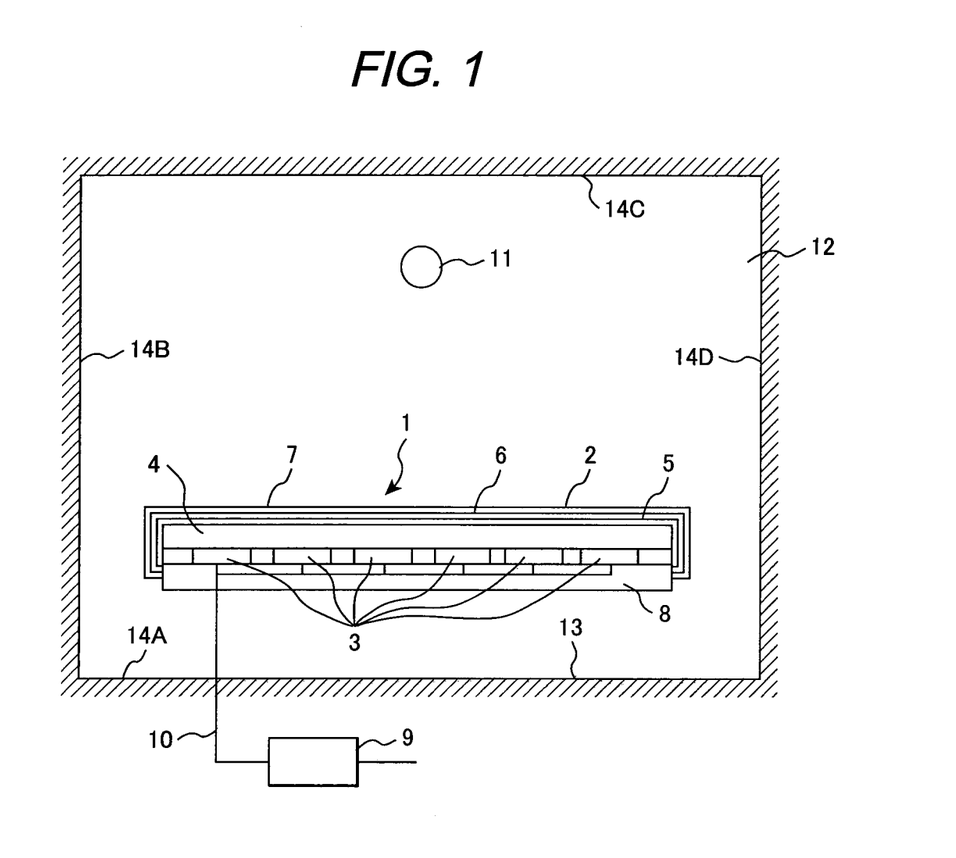
FIG. 1 is a structural diagram showing a photovoltaic power generation system applied to an electric power generation method using solar cells according to embodiment 1 which is a preferred one embodiment of the present invention.

Each power generation panel 2 has a plurality of solar cells 3, a phosphor member 4, a reflector 5, a moderator member 6, a light shielding member 7, and a board (support member) 8. The plurality of solar cells 3 is placed on one surface of the board 8. The phosphor member 4 is placed on the solar cells 3 and board 8 so as to cover the solar cells 3. The reflector 5 is placed on the phosphor member 4 and board 8 so as to cover the phosphor member 4. A mirror material coated with an aluminum foil, plated with chromium, or treated by another method is used as the reflector 5. The moderator member 6 is placed on the reflector 5 and board 8 so as to cover the reflector 5. The light shielding member (black paper, for example) 7 is placed on the moderator member 6 and board 8 so as to cover the moderator member 6.

The power conditioner 9 is connected by a wire 10 to the solar cells 3 mounted on the board 8 on each power generation panel 2.

A sealed solar cell storage room 12 is formed in the ground. The solar cell storage room 12 has four sidewalls 13 made of reinforced concrete to shield radiation. The four sidewalls 13 of the solar cell storage room 12 have side surfaces 14A, 14B, 14C, and 14D. The floor and ceiling (not shown) of the solar cell storage room 12 are also made of reinforced concrete. The solar cell storage room 12 has an inlet/outlet port (not shown) through which the power generation panels 2 are carried in and out. The inlet/outlet port is sealed with a shielding door (not shown).

The radiation source 11 is placed in the solar cell storage room 12. The power generation panels 2 are placed in the solar cell storage room 12 so that the moderator member 6 faces the radiation source 11 and the board 8 is disposed opposite to the side on which the radiation source 11 is placed. The light shielding member 7, moderator member 6, reflector 5, phosphor member 4, and solar cells 3 are placed in that order, from the radiation source 11 toward one of the sidewalls 13. The power conditioner 9 connected to the solar cells 3 by the wire 10, is placed outside the solar cell storage room 12 to prevent an adverse effect due to the radiation emitted from the radiation source 11.

An amorphous silicon solar cell is used as the solar cell 3. An intensifying screen used in, for example, the medical field is employed as the phosphor member 4. The intensifying screen is made of, for example, $Gd_2O_2S$:Tb. The thickness of the phosphor member 4 including $Gd_2O_2S$:Tb is 300 to 500 μm.

In this embodiment, radioactive waste that was generated in the reprocessing of the spent nuclear fuel is used as the radiation source 11. The reprocessing of the spent nuclear fuel is performed to recover nuclear fuel materials including fissionable materials (such as U-235 and Pu-239) from the spent nuclear fuel including in a spent fuel assembly that has been taken out of a nuclear reactor and stored in a nuclear fuel storage pool. The recovered nuclear fuel materials are used as nuclear fuel materials for a freshly manufactured fuel assembly. In the reprocessing of the spent nuclear fuel, materials other than the recovered nuclear fuel materials are left as radioactive wastes. These radioactive wastes are vitrified as high-level radioactive wastes and buried in the ground in nowaday. However, these radioactive wastes include Cs-137, Sr-90, and other radioisotopes with a long half-life time, and substantially exhaustlessly emit the radiation. These radioactive wastes are an effective resource in the electric power generation method in the present embodiment in which solar cells are used, and can be used as the radiation source 11. The radiation source 11 is formed by filling a sealed vessel (not shown) with the radioactive waste.

In the solar cell storage room 12, the radiation emitted from the radioisotopes included in the radiation source 11 travels toward the power generation panels 2. The following description focuses on Cs-137 included in the radiation source 11. Cs-137 emits gamma rays of 660-keV. In the power generation panel 2, the gamma rays pass through the light shielding member 7 and reach the moderator member 6. The energy of each gamma ray is not practically consumed by the light shielding member 7, but the gamma ray is moderated by the moderator member 6 and its energy is reduced. Specifically, after the gamma ray has passed through the moderator member 6, its energy is reduced to 330 keV. Since a tungsten film, which is used as the moderator member 6, is also effective in radiation shielding, charged particles such as electrons, alpha rays, and the like emitted from the radioactive waste, which is the radiation source 11, are shielded by the tungsten film. Therefore, the radiation that has passed through the moderator member 6 can be handled as photons.

The gamma ray, the energy of which has been reduced by passing through the moderator member 6, further passes through the reflector 5 and is injected to the phosphor member 4. Since the energy of the gamma ray is 330 keV, which is larger than 100 keV, the energy of the gamma ray is not practically absorbed in the phosphor member 4. Accordingly, for some 330-keV gamma rays, visible light is not practically emitted from the phosphor member 4. The gamma ray of 330 keV passes through the phosphor member 4, solar cell 3, and board 8, and is then reflected on the side surface 14A. The direction in which the gamma ray reflected on the side surface 14A travels depends on the angle at which the gamma ray hits the side surface 14A. For example, the gamma ray reflected on the side surface 14A may be further reflected on the side surface 14B and then on the side surface 14C, and may be injected to the power generation panel 2 again. Then, this gamma ray is moderated again by the tungsten film, which is the moderator member 6. The gamma ray, the energy of which has been reduced by the two reflections on the side surfaces 14B and 14C, is moderated again by the moderator member 6, reducing its energy to 100 keV or less.

The gamma ray with an energy of 100 keV or less is injected again to the above phosphor (intensifying screen having $Gd_2O_2S$:Tb as the fluorescent material, for example) 4. When the gamma ray with this energy was injected on the phosphor member 4, the phosphor member 4 emits fluorescence, that is, visible light, as described below. Since, in the phosphor member 4, an electron present at the first stable level is excited by the energy of a gamma ray of 100 keV or less, and transfer to the second stable level, as shown in FIG. 3. By injecting of Gamma rays with the energy of 100 keV or less on the phosphor member 4, the number of electrons transferring from the first stable level to the second stable level becomes a very large, increasing the number of electrons staying at the second stable level. The number of electrons that return from the second stable level to the first stable level is also increased. Energy emitted when the electrons return to the first stable level becomes fluorescence, so an increase in the number of electrons that return to the first stable level results in an increase in the amount of emitted fluorescence (visible light).

When an intensifying screen including $Gd_2O_2S$:Tb is used, visible light having a brightness of about 10 to 15 $Cd \cdot m^{-2}/Rsec^{-1}$ and a wavelength of 550 nm generates. The value of this brightness is equivalent to 1/10,000 of AM1.5, which is one of the sunlight conditions. Therefore, an exposure dose of $10^4$R/sec or more is obtained, so the visible light generated by the phosphor member 4 has light intensity equal to or higher than that of sunlight. The visible light generated by the phosphor member 4 is injected on the solar cells 3. The solar cells 3 efficiently convert the light energy into electric energy due to the photovoltaic effect matching the wavelength region of the incident visible light. When the amount of visible light injected on the solar cell 3 is increased, the amount of electric power generated by the solar cells 3 is also increased accordingly.

The radiation such as, for example, gamma rays is emitted in all directions from the radiation source 11. Therefore, some emitted gamma rays may be reflected on the side surface 14C and then on the side surface 14B, and then injected to the power generation panel 2. Other emitted gamma rays may be reflected on the side surface 14D and then on the side surface 14C, further reflected on the side surface 14B, and injected to the power generation panel 2. Other emitted gamma rays may be reflected on the side surface 14C and injected to the power generation panel 2. After traveling through various routes, the emitted gamma rays are injected to the power generation panel 2, in this way. In any case, when the energy of the gamma ray moderated by the moderator member 6 falls to or below 100 keV, the gamma ray causes the phosphor member 4 to generate visible light. When the energy of the moderated gamma ray is larger than 100 keV, the gamma ray does not cause the phosphor member 4 to generate visible light. In this case, the gamma ray is reflected on the side surface 14C and then on some other side surfaces and injected to the power generation panel 2 again. When the energy of the gamma ray moderated by the moderator member 6 falls to or below 100 keV, the phosphor member 4 generates visible light, as described above.

DC electric power generated by each solar cell 3 is supplied to the power conditioner 9 through the wire 10, by which the DC electric power is converted to AC electric power. The electric power converted to AC is supplied from the power conditioner 9 to an appropriate load. Electric power output from all the solar cells 3 included in one power generation panel 2 to the wire 10 has a voltage of 0.5 V and a current of 50 mA. When 600 power generation panels 2 are arranged, the voltage is increased to 300 V and the current is increased to 30 A, obtaining an electric power of 9 kW.

The power generation panel 2 in the present embodiment includes the moderator member 6, so the radiation moderated by the moderator member 6 can be injected on the phosphor member 4, by which the amount of generated visible light can be increased. The use of the moderator member 6 enables the moderation of the radiation to be faster, thereby increasing the amount of visible light generated by the phosphor member 4 per unit time. The amount of electric power generated per solar cell (or per unit area) can be increased 1,000 to 10,000 times in comparison with the photovoltaic power generation systems described in Japanese Patent Laid-open No. 2002-341094 and Japanese Patent Laid-open No. 7(1995)-274417.

The radiation source 11 used in the present embodiment is the radioactive waste that was generated in the reprocessing of the spent nuclear fuel and includes radioisotopes with a long half-life. At present, the radioactive waste is one of the most powerful gamma ray sources on the earth. In the past, the radioactive wastes are handled as cumbersome high-level radioactive wastes, so they are vitrified, sealed in a specific vessel, and buried in a deep place under the ground to store the radioactive wastes for over 100 years or more. Therefore, a vast amount of energy of the radiation emitted from the vitrified high-level radioactive wastes warms peripheral strata. In the present embodiment, however, the exhaustless energy of the radiation, which is emitted from the radioactive wastes having been handled as cumbersome wastes, can be used to generate electric power. The present embodiment could convert the radioactive wastes to an effective resource. This is an immeasurable merit to the humankind.

A radioactive waste generated in the reprocessing of the spent nuclear fuel is used as the radiation source 11, as described above. Therefore, after the power generation panels 2 and radiation source 11 have been placed in the solar cell storage room 12 formed in the ground, although there are restrictions by the half life of the radio-isotopes, the electric power can be practically semi-permanently obtained. This is because the radioactive waste includes radioisotopes with a long half-life and the radiation semi-permanently emitted from the radioisotopes can be injected to the power generation panels 2. The photovoltaic power generation system 1 in the present embodiment can continuously generate electric power without suffering from varying efficiency due to solar radiation directions and from electric power generation restrictions due to weather conditions and day/night distinction as in solar electric power generation using conventional solar cells. Furthermore, the photovoltaic power generation system 1 does not generate $CO_2$ as in other conventional power generation.

The use of the radioactive waste as the radiation source 11 in the photovoltaic power generation system 1 can eliminate the need to vitrify that radioactive waste as a high-level radioactive waste. Therefore, the amount of vitrification of high-level radioactive waste can be reduced.

In the present embodiment, the charged particles such as electrons and alpha rays and the like emitted from the radioactive waste used as the radiation source 11 are stopped at the moderator member 6, so the charged particles are not injected on the solar cells 3. Therefore, the mounting of the moderator member 6 can prevent the solar cells 3 from being damaged by charged particles.

The reflector 5 disposed on the power generation panel 2 improves the possibility that visible light generated by the phosphor member 4 is injected on the solar cells 3. Even when the visible light generated by the phosphor member 4 travels toward the radiation source 11, the visible light is reflected on the reflector 5 toward the solar cells 3 and enters the solar cells 3. Thus, the amount of visible light injected on the solar cells 3 is increased, further increasing the amount of electric power generated by the solar cells 3.

The light shielding member 7 shades external visible light traveling toward the power generation panels 2, preventing visible light from making incidence on the solar cells 3 from the outside of the power generation panels 2. Since the moderator member 6 can also shade external visible light, the mounting of the light shielding member 7 can be eliminated.

An intensifying screen, made of $CaWO_4$, with a thickness of 300 to 500 μm may be used as the phosphor member 4. Visible light obtained by the intensifying screen has a brightness of about $1.10 \, Cd \cdot m^{-2}/Rsec^{-1}$ and a wavelength of 300 to 600 nm (centered around 430 nm). The visible light obtained from the $CaWO_4$ intensifying film has a shorter wavelength than visible light obtained from a $Gd_2O_2S:Tb$ intensifying screen, and the visible light collection efficiency of the solar cells 3 is also reduced. Compared with the amount of electric power generated by the power generation panel 2, the amount of electric power generated by the power generation panel having the moderator member 6, $CaWO_4$ intensifying screen, and amorphous silicon solar cells 3 is smaller, but higher than in Japanese Patent Laid-open No. 2002-341094 and Japanese Patent Laid-open No. 7(1995)-274417.

The effective atomic number of the tungsten film, which is 74, is larger than the effective atomic number of $CaWO_4$, which is 62. Therefore, the deceleration effect of the tungsten film is large.

A lead film with a thickness of, for example, 100 μm may be used as the moderator member 6, instead of the tungsten film. As with the tungsten film, the lead film can also moderate the radiation.

[Embodiment 2]

An electric power generation method using solar cells according to embodiment 2 which is another embodiment of the present invention will be described below. A photovoltaic power generation system 1A used in this electric power generation method will be described with reference to FIG. 9. In the photovoltaic power generation system 1A in the present embodiment, the plurality of power generation panels (three power generation panels, for example) 2 in the photovoltaic power generation system 1 is disposed parallel in a direction from the radiation source 11 toward one of the side walls 13 in the solar cell storage room 12, between the radiation source 11 and the one side wall 13 of the solar cell storage room 12. The other structures of the photovoltaic power generation system 1A are the same as in the photovoltaic power generation system 1.

Figure 9:
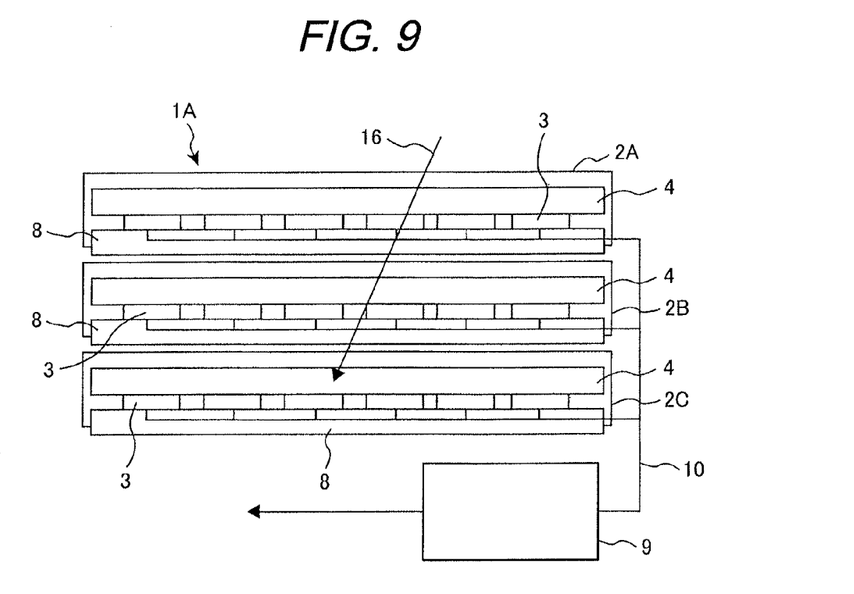
FIG. 9 is a structural diagram showing a photovoltaic power generation system applied to an electric power generation method using solar cells according to embodiment 2 which is another embodiment of the present invention.

In the photovoltaic power generation system 1A, three power generation panels 2A, 2B, and 2C are disposed between the radiation source 11 and one of the sidewalls 13 of the solar cell storage room 12. The power generation panels 2A, 2B, and 2C are disposed parallel to, for example, the side surface 14A (not shown). The power generation panels 2A, 2B, and 2C each have the same structure as the power generation panel 2 shown in FIG. 1. Each solar cell 3 in the power generation panels 2A, 2B, and 2C is connected to the power conditioner 9 through the wire 10.

The radiation emitted from the radiation source (including a radioactive waste generated in the reprocessing of the spent nuclear fuel) 11 in the solar cell storage room 12, for example, gamma rays 16 with an energy of 660 keV emitted from Cs-137 are injected on the power generation panel 2A, which is present at a position closest to the radiation source 11 in the photovoltaic power generation system 1A. This gamma ray 16 is moderated by the moderator member 6 of the power generation panel 2A, reducing its energy to 330 keV. The gamma ray 16 of 330 keV is moderated by the moderator member 6 of the power generation panel 2B, further reducing its energy to 165 keV. The gamma ray 16 of 165 keV is moderated by the moderator member 6 of the power generation panel 2C, which is disposed at a position farthest from the radiation source 11 on a horizontal cross section of the solar cell storage room 12, further reducing its energy to about 82 keV. Since, in the power generation panel 2C, the gamma ray 16 with an energy of about 82 keV is injected on the phosphor member 4, visible light is generated by the phosphor member 4. Since the visible light is injected on the solar cells 3 of the power generation panel 2C, electric power is generated in the solar cells 3. In the case described above, the gamma rays 16 do not cause the phosphor members 4 of the power generation panels 2A and 2B to generate electric power.

As described above, the radiation is emitted from the radiation source 11 in various directions, travels through various routes, and is injected on appropriate power generation panels. For some injected gamma rays, visible light is generated even by the phosphor member 4 on either of the power generation panels 2A and 2B, so the corresponding solar cells 3 can generate electric power. The electric power generated by all the solar cells 3 is converted to AC power by the power conditioner 9 because the all solar cells 3 disposed on the power generation panels 2A, 2B, and 2C are connected to the power conditioner 9 through the wire 10.

In the present embodiment as well, the effects generated in the embodiment 1 can be obtained. In particular, according to the present embodiment, the radiation can be moderated faster than in embodiment 1 because the power generation panels are disposed as a plurality of layers (power generation panels 2A, 2B, and 2C), increasing the amount of visible light generated by the phosphor member 4 per unit time. Accordingly, the amount of electric power generated per unit time is further increased, as compared with the embodiment 1.

[Embodiment 3]

An electric power generation method using solar cells according to embodiment 3 which is another embodiment of the present invention will be described below. A photovoltaic power generation system 1B used in this electric power generation method will be described with reference to FIGS. 10 and 11. In the photovoltaic power generation system 1B in the present embodiment has a structure that a plurality of power generation panel modules 15, each of which includes the power generation panels 2A, 2B, and 2C used in the photovoltaic power generation system 1A, is annularly disposed so as to surround the circumference of the radiation source 11. The other structures of the photovoltaic power generation system 1B are the same as in the photovoltaic power generation system 1A.

Figure 10:
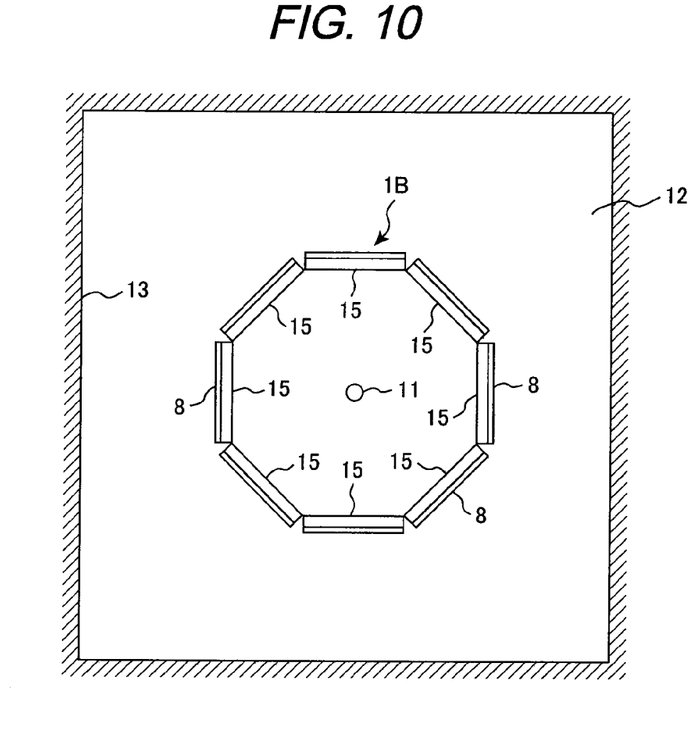
FIG. 10 is a structural diagram showing a photovoltaic power generation system applied to an electric power generation method using solar cells according to embodiment 3 which is another embodiment of the present invention.
Figure 11:
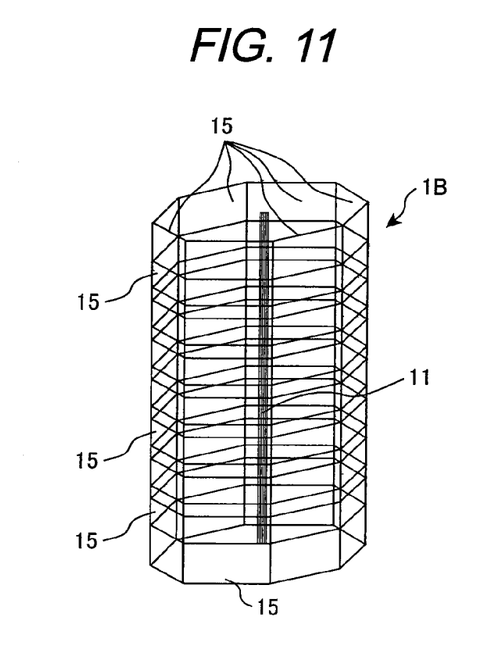
FIG. 11 is a schematic perspective view showing a power generation panel section of a photovoltaic power generation system shown in FIG. 10.

As the radiation source 11 used in the present embodiment, the radioactive waste generated in the reprocessing of the spent nuclear fuel is stored in a sealed container that elongates in its axial direction. The radiation source 11 is disposed so as to stand vertically on the floor of the solar cell storage room 12, with the axial direction matching the vertical direction. The power generation panel modules 15 are disposed in the solar cell storage room 12 as with the radiation source 11.

Each power generation panel module 15 is disposed so that the power generation panel 2A is disposed at a position closest to the radiation source 11 on a horizontal cross section of the photovoltaic power generation system 1B, and the power generation panel 2C is disposed at a position farthest from the radiation source 11. The power generation panel 2B is disposed between the power generation panels 2A and 2C. That is, the power generation panels 2A, 2B, and 2C are disposed in that order, from the radiation source 11 toward the sidewalls 13.

The plurality of power generation panel modules 15 is not only annularly disposed so as to surround the radiation source 11, but also annularly disposed in the axial direction of the radiation source 11 so as to form a stack structure having several stages (see FIG. 11). Specifically, the plurality of power generation panel modules 15 is disposed so as to surround the radiation source 11, for example, to form a cylinder with an octagonal cross section.

In the present embodiment, the radiation emitted from the radiation source 11 (gamma rays emitted from Cs-137, for example) is always injected on the power generation panel 2A of one of the power generation panel modules 15. Thereafter, after which the gamma rays are moderated by the moderator members 6 of the power generation panels 2A, 2B, and 2C and their energy is reduced, as in the embodiment 2. In the power generation panel in which the energy has been reduced to 100 keV or less, when gamma rays with an energy of 100 keV or less are injected on the phosphor member 4, the phosphor member 4 generates visible light, contributing to electric power generation by the solar cells 3. If a gamma ray moderated by the moderator member 6 of the power generation panel 2C, which is disposed at the outermost position, has an energy of more than 100 keV, this gamma ray is reflected on the side surface of one of the side walls 13 and is injected on the power generation panel 2C of one of the power generation panel modules 15. The gamma ray travels toward the power generation panel 2A, which is disposed at the innermost position. During this process, the gamma ray is moderated by the moderator member 6 of the power generation panel 2C and the like, and its energy is reduced to 100 keV or less. The phosphor member 4 in the power generation panel in which the energy has been reduced to 100 keV or less generates visible light, causing the solar cells 3 in the power generation panel to generate electric power.

Since the power conditioner 9 is connected to all the solar cells 3 disposed on the three power generation panels of all the power generation panel modules 15 through the wire 10, electric power generated by all the solar cells 3 is supplied to the power conditioner 9 and then converted to AC power.

In the present embodiment as well, the effects generated in the embodiment 2 can be obtained. Basically, the direction in which a Compton-scattered gamma ray orbits cannot be identified. Therefore, when a plurality of power generation panel modules 15 is annularly disposed around the radiation source 11 as in the present embodiment, the Compton-scattered gamma ray can be injected on one of the power generation panels, enabling the most efficient power generation. All Compton-scattered gamma rays can be captured by the plurality of annularly disposed power generation panel modules.

[Embodiment 4]

Figure 12:
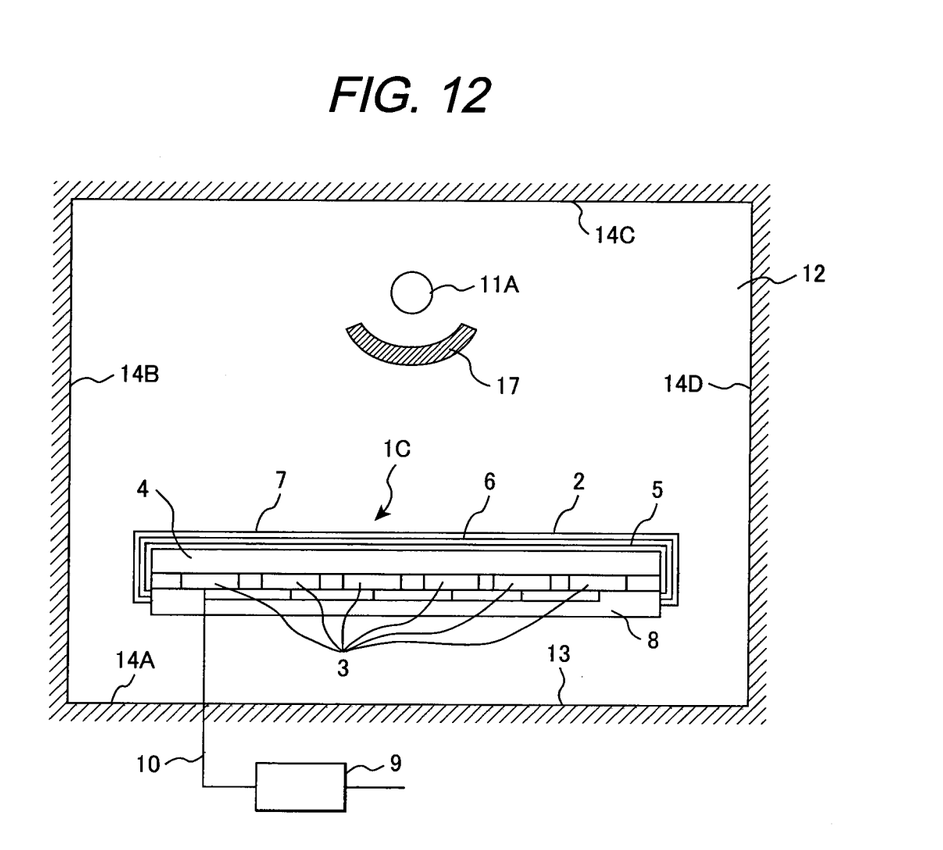
FIG. 12 is an explanatory drawing showing an electric power generation method using solar cells according to embodiment 4 which is another embodiment of the present invention.

An electric power generation method using solar cells according to embodiment 4 which is another embodiment of the present invention will be described below with reference to FIG. 12. A photovoltaic power generation system 1C used in this electric power generation method has a structure that in the photovoltaic power generation system 1, the radiation source 11 is exchanged for a radiation source 11A and the phosphor member 4 is a phosphor member (ZnS:Cu,Al, ZnS:Cu,Au,Al, or $Y_2O_2S$:Eu) intended for a cathode-ray tube, which emits fluorescence by electron impacts. The other structures of the power generation panel 1C are the same as in the photovoltaic power generation system 1. The radiation source 11A used in the present embodiment is Co-60 rather than the radiation source 11 used in the embodiments 1 to 3. The radiation source 11A and power generation panels 2 are disposed in the solar cell storage room 12. A scattering body 17 having a concave surface on the same side as the radiation source 11A is disposed between the radiation source 11A and each power generation panel 2. Gamma rays of 1.1 MeV and 1.3 MeV are emitted from Co-60 included in the radiation source 11A. Since the scattering body 17 is disposed, each of these gamma rays is not directly injected on the power generation panel 2, but the gamma rays reflected at least once on the concave surface of the scattering body 17 or on one of the side surfaces 14A, 14B, 14C, and 14D of the side walls 13 of the solar cell storage room 12, are injected on the power generation panel 2. The gamma rays of 1.1 MeV and 1.3 MeV are moderated by the scattering body 17 and the like and average energies are reduced to about half (about 550 keV and 650 keV) the energies of the incident gamma rays. When the gamma rays with this reduced energies are injected on the power generation panel 2, the gamma rays are further moderated by the moderator member 6. The average energies of the gamma rays are similarly reduced to half (about 275 keV and 325 keV) the energies of the incident gamma rays due to the effect of the plurality of moderator members 6. When the gamma rays with this reduced energies are injected on the phosphor member 4, which is intended for a cathode-ray tube, the phosphor member 4 emits fluorescence, which is visible light. The solar cells 3 that receive the fluorescence generate electric power.

In the present embodiment as well, the effects generated in the embodiment 1 can be obtained. In the embodiments 2 and 3, the radiation source 11A may be used instead of the radiation source 11.

[Industrial Applicability]

The present invention can be applied to an electric power generation method in which solar cells are used.

[Reference Signs List]

1, 1A, 1B: photovoltaic power generation system, 2, 2A, 2B, 2C: power generation panel, 3: solar cell, 4; phosphor member, 6: moderator member, 9: power conditioner, 11, 11A: radiation source, 12: solar cell storage room, 13: sidewall, 15: power generation panel module.

What is claimed is:

1. An electric power generation method using a solar cell, the method comprising steps of:
   moderating radiation by a moderator comprised of lead or tungsten and having a thickness within a range of 1 μm to 1 mm, wherein said radiation is emitted from radioactive waste as a radiation source;
   injecting said radiation with energy moderated by said moderator on a phosphor member and generating visible light in said phosphor member; and
   injecting said generated visible light on said solar cell and generating electric power in said solar cell,
   wherein the radioactive waste comprises Cs-137 or Sr-90.

2. The electric power generation method according to claim 1, wherein said radioactive waste is generated in reprocessing of spent nuclear fuel.

3. A photovoltaic power generation system, comprising:
- a moderator member comprised of lead or tungsten and having a thickness within a range of 1 μm to 1mm and moderating radiation emitted from radioactive waste as a radiation source;
- a phosphor member receiving said radiation with energy moderated by said moderator, and generating visible light; and
- a solar cell receiving said visible light and generating electric power,
- wherein the radioactive waste comprises Cs-137 or Sr-90.

4. The photovoltaic power generation system according to claim 3, wherein
- said moderator member, said phosphor member, and said solar cell are placed in that order in a direction away from said radiation source.

5. The photovoltaic power generation system according to claim 4, wherein said radioactive waste is generated in reprocessing of spent nuclear fuel.

6. The photovoltaic power generation system according to claim 5, further comprising a plurality of power generation panels having said moderator member, said phosphor member and said solar cell,
- wherein said plurality of power generation panels is disposed parallel in a direction away from said radiation source.

7. The photovoltaic power generation system according to claim 5, further comprising a plurality of power generation panels having said moderator member, said phosphor member and said solar cell,
- wherein said plurality of power generation panels is annularly disposed so as to surround said radiation source.

8. The photovoltaic power generation system according to claim 4, further comprising a plurality of power generation panels having said moderator member, said phosphor member and said solar cell,
- wherein said plurality of power generation panels is disposed parallel in a direction away from said radiation source.

9. The photovoltaic power generation system according to claim 4, further comprising a plurality of power generation panels having said moderator member, said phosphor member and said solar cell,
- wherein said plurality of power generation panels is annularly disposed so as to surround said radiation source.

10. The photovoltaic power generation system according to claim 3, further comprising a reflector disposed between said moderator member and said phosphor member.

11. The photovoltaic power generation system according to claim 3, further comprising a DC/AC conversion apparatus converting DC electric power to AC electric power,
- wherein said solar cell is connected to said DC/AC conversion apparatus.

12. The photovoltaic power generation system according to claim 3, wherein said phosphor member includes any one of $Gd_2O_2S$:Tb, $CaWO_4$, ZnS:Cu,Al, ZnS:Cu,Au,Al, and $Y_2O_2S$:Eu.

* * * * *